United States Patent [19]

Sevenhans et al.

[11] Patent Number: 5,625,318
[45] Date of Patent: Apr. 29, 1997

[54] DIFFERENTIAL AMPLIFIER HAVING A DOUBLE DIFFERENTIAL AMPLIFIER PAIR WITH INTERCONNECTED CONTROL ELECTRODES

[75] Inventors: Joannes M. J. Sevenhans, Brasschaat; Eric Duvivier, Anderlues; Daniel Sallaerts, Aarschot, all of Belgium

[73] Assignee: Alcatel NV, Rijswijk, Netherlands

[21] Appl. No.: 541,904

[22] Filed: Oct. 10, 1995

[30] Foreign Application Priority Data

Oct. 11, 1994 [EP] European Pat. Off. .............. 94202939

[51] Int. Cl.$^6$ ........................................ G06G 7/26
[52] U.S. Cl. ........................ 327/563; 330/252; 330/260
[58] Field of Search ........................ 327/231, 237–239, 327/246, 247, 254, 255, 563; 330/252, 253

[56] References Cited

U.S. PATENT DOCUMENTS

| | | | |
|---|---|---|---|
| 4,427,949 | 1/1984 | Yamaguchi et al. | 330/252 |
| 4,560,955 | 12/1985 | Sauer | 330/252 |
| 4,745,370 | 5/1988 | McGinn | 330/252 |
| 4,774,475 | 9/1988 | Lavoie | 330/252 |
| 4,806,792 | 2/1989 | Simmons | 330/252 |

FOREIGN PATENT DOCUMENTS 0608577 8/1994 European Pat. Off. .

OTHER PUBLICATIONS

"Analysis and design of analog integrated circuits" of P.R. Gray and R.G. Meyer, published by Wiley & Sons, NY 1977, pp. 563–575.
"Pulse, Digital and Switching Waveforms" by Millman and Tabu (1965), Chapter 4–6 entitled Frequency response of a transistor stage, pp. 121–126, Chapter 4–6.

*Primary Examiner*—Timothy P. Callahan
*Assistant Examiner*—Kenneth B. Wells
*Attorney, Agent, or Firm*—Ware, Fressola, Van Der Sluys & Adolphson LLP

[57] ABSTRACT

A tunable quadrature phase shifter including two branches each constituted by the cascade connection of a filter, an amplifier and a summing circuit, and two cross-connections constituted by amplifiers interconnecting the filter of one branch to the summing circuit of the opposite branch. An accurate 90 degrees phase shift between the two output signals is obtained by controlling the tail currents of the four amplifiers. The phase shifter used in mobile telecommunication transceivers may be easily and accurately tuned because the signals used in the summing circuits all have a similar amplitude. It is further adapted to operate with only a 3 Volt battery supply as used in wireless phones. The bandwidth of the amplifiers is increased by using double differential pair amplifiers which behave as cascode arrangements.

2 Claims, 4 Drawing Sheets

DDPA 5,625,318

DIFFERENTIAL AMPLIFIER HAVING A DOUBLE DIFFERENTIAL AMPLIFIER PAIR WITH INTERCONNECTED CONTROL ELECTRODES

TECHNICAL FIELD

The present invention relates to a tunable quadrature phase shifter having an input and first and second outputs on which orthogonal first and second output signals are provided respectively, said input being coupled both to said first output through the cascade connection of a first filter circuit, a first amplifier and a first summing circuit, and to said second output through the cascade connection of a second filter circuit, a second amplifier and a second summing circuit, the junction point of said first filter circuit and said first amplifier being coupled to said second summing circuit via a first device and the junction point of said second filter circuit and said second amplifier being coupled to said first summing circuit via a second device, each of said first and second devices being controlled by a phase adjust signal.

BACKGROUND OF THE INVENTION

Such a quadrature phase shifter is already known in the art, e.g. from the European Patent Application EP-A1-0608577 of BELL TELEPHONE MANUFACTURING COMPANY N.V. entitled "GMSK modulator with automatic calibration" and published on Aug. 3, 1994. Therein, the first and second filter circuits provide respective first and second filter output signals which are roughly phase shifted by +45 degrees and −45 degrees with respect to a signal applied to the input. These roughly orthogonal filter output signals are amplified in their respective branches by the first and second amplifiers thereof. Each of the above first/second device used in this known phase shifter is a first/second multiplier which multiplies the first/second filter output signal of the first/second filter circuit with the phase adjust signal so as to provide a first/second device smaller output signal, i.e. a signal whose phase is the same as that of the first/second filter output signal but having a smaller amplitude. The device smaller output signal is then vectorially added to the larger amplified first/second filter output signal of the opposite branch by the second/first summing circuit and the results of these additions are the above second and first orthogonal output signals. An accurate angle of 90 degrees between these two output signals can thus be obtained by modifying the amplitude and/or the sign of the device smaller output signals. This modification is performed by changing the phase adjust signal which controls the devices, i.e. the multipliers. This phase adjust signal is for instance supplied by an external control circuit which measures the phase shift between the first and the second output signals.

This known phase shifter is used in the GSM (Global System for Mobile communications) and other radio transmitters and receivers where an accurate 90 degrees phase shift is necessary to obtain a sufficient image rejection in the transmitter and to have a correct 90 degrees phase difference between the I (In-phase) and Q (Quadrature-phase) base band phase vector signals in the receiver.

Over the past few years, Silicon Bipolar and GaAs MMIC's (Microwave Monolithic Integrated Circuits) were competing for the wireless phone radio transceiver application. As the circuits thereof required a 5 Volt supply, a known Gilbert cell could be perfectly used as a multiplier. Such a Gilbert cell is for instance known from the book "*Analysis and design of analog integrated circuits*" of P. R. Gray and R. G. Meyer, published by J. Wiley & Sons, New York, 1977, and more particularly from pages 563 to 575 thereof. It has, between the ground and the VCC (5 Volt) supply terminal, three levels of transistors: a bias signal or current source input level, a radio signal input level and a local oscillator input level.

Today, designers are struggling for the next step: to use a 3 Volt supply in battery operated wireless phones. Such a 3 Volt supply, with a tolerance of ±10%, allows to reduce the number of batteries, the cost, the volume and the weight of the handset. However, the above three transistor levels Gilbert cell can then no longer be used since the 1 Volt collector-to-emitter voltage drop (VCE) produced over each transistor, i.e. 3 Volts in total, leaves no headroom for the useful signal, especially when the supply voltage drops to 2.7 Volt at the end of the battery cycle. New circuits need thus to be designed.

Another problem with the above known phase shifter is the relative large amplitude difference of the different signals applied to the summing circuits, i.e. of the device smaller output signals and the larger signals at the output of the amplifiers. Indeed, in the transistor technique, e.g. from Chapter 4–6: "Frequency response of a transistor stage The short circuit current gain" at pages 121 to 126 of the McGraw-Hill book "*Pulse, Digital and Switching Waveforms*" by Millman and Taub (1965), it is well known that the transition frequency 'fT' at which the short-circuit common-emitter current gain of a transistor attains unity and which thus corresponds to the bandwidth of the amplifier using the transistor, dramatically varies as a function of the emitter-to-collector voltage and/or the emitter current of this transistor. Because of the above large amplitude differences of the signals supplied to the first and second amplifiers and to the amplifiers included in the Gilbert cells, it is obvious that the gain thereof is not easy to control. As a result, the tuning of the known phase shifter is relatively difficult. This is especially true at the high frequencies at which it is operated in a radio transmitter or receiver.

SUMMARY OF THE INVENTION

An object of the present invention is to provide a tunable quadrature phase shifter of the above known type, but which is adapted to operate with a lower supply voltage, e.g. of 3 Volt, and of which the phase shift between the two output signals can be easily and accurately tuned.

According to the invention, this object is achieved due to the fact that said first and second devices are constituted by third and fourth amplifiers which are similar to said first and second amplifiers, each of said amplifiers being associated to a distinct variable tail current source controlled by said phase adjust signal, that said first summing circuit provides said first output signal by subtracting output signals of said first and fourth amplifiers, and that said second summing circuit provides said second output signal by adding output signals of said second and third amplifiers.

In this way, the use of Gilbert cells is avoided and the phase shifter is adapted to operate with a relatively low supply voltage, e.g. of 3 Volt. Furthermore, as the four amplifiers are similar and are controlled by the same phase adjust signal via their tail current source, they all have the same transition frequency fT, i.e. they have the same bandwidth. The output signals of these amplifiers have thus the same amplitude and the phase shifter can be easily and accurately tuned by simultaneously varying these amplitudes by the same amount, as will be explained later.

Other characteristic features of the present invention are that said first filter circuit is a balanced Resistor-Capacitor integrator, that said second filter circuit is a balanced Capacitor-Resistor differentiator, and that the four amplifiers are differential operational amplifiers each having a first and a second output.

In this way, the present quadrature phase shifter behaves as a fully balanced differential device which is less sensitive to supply noise than a single ended device and improves the elimination of unwanted signal harmonics.

In more detail, the four amplifiers are adapted to be controlled by said phase adjust signal via a differential amplifying arrangement of which a first output controls the variable tail current sources of said first and third amplifiers and of which a second output controls the variable tail current sources of said second and fourth amplifiers.

Furthermore, in said first summing circuit the first output of said first differential amplifier is connected to the second output of said fourth differential amplifier and the second output of said first differential amplifier is connected to the first output of said fourth differential amplifier, whilst in said second summing circuit the first output of said second differential amplifier is connected to the first output of said third differential amplifier and the second output of said second differential amplifier is connected to the second output of said third differential amplifier.

Because of the relatively low supply voltage, no headroom of the useful signal may be wasted and the currents in the phase shifter need to be accurately controlled.

To this end, further characteristic features of the present invention are that said differential amplifying arrangement includes a first and a second tuning circuit controlled in a differential way by said phase adjust signal, that said first tuning circuit controls the variable tail current sources of said first and third amplifiers, that said second tuning circuit controls the variable tail current sources of said second and fourth amplifiers, that said differential amplifying arrangement further includes a first current source controlled by said first tuning circuit and a second current source controlled by said second tuning circuit, and that said first and second current sources control in feedback said first and second tuning circuits.

Owing to the feedback provided by the first and second currents sources, the output signals of the differential amplifying arrangement are very stable and the variable tail current sources of the four amplifiers are accurately controlled.

To increase the bandwidth of the four differential amplifiers of the present phase shifter a known solution consists in 'cascoding' them by introducing a common base stage at the outputs of the transistors of these differential pairs. However, here again a low supply voltage leaves no headroom for the transistors of the cascode arrangement.

Therefore, in a preferred embodiment of the present invention, each of the four differential amplifiers is a double differential pair amplifier and each of said variable tail current source is a double tail current source.

In more detail:
    said variable tail current source includes in parallel a first and a second current branch each constituted by the series connection of the main path of a bias transistor and a resistor, both said bias transistors being simultaneously controlled by said phase adjust signal;
    said double differential pair amplifier includes first and second parallel branches connected to said first and second current branch respectively, each of said parallel branches comprising the series connection of a load resistor and the main path of a transistor the control electrodes of which being interconnected; and
    said double differential pair amplifier further includes third and fourth branches in parallel with said first and second branch respectively and each comprising a transistor connected of which the control electrode constitutes an input of the differential amplifier.

Moreover, the interconnected control electrodes of the transistors of said first and second parallel branches are connected both to the control electrodes of the transistors of said third and fourth parallel branch via a resistor respectively, and to the junction point of the load resistor with said transistor via a capacitor respectively.

In this way, a low supply voltage may still be used because only two levels of transistors are stacked on top of each other leaving a large headroom for the signal, whilst the bandwidth is extended because the transistors of the first and second parallel branches operate as common base transistors as will be explained later.

BRIEF DESCRIPTION OF THE DRAWINGS

The above mentioned and other objects and features of the invention will become more apparent and the invention itself will be best understood by referring to the following description of an embodiment taken in conjunction with the accompanying drawings wherein.

BEST MODE FOR CARRYING OUT THE INVENTION

Figure 1:
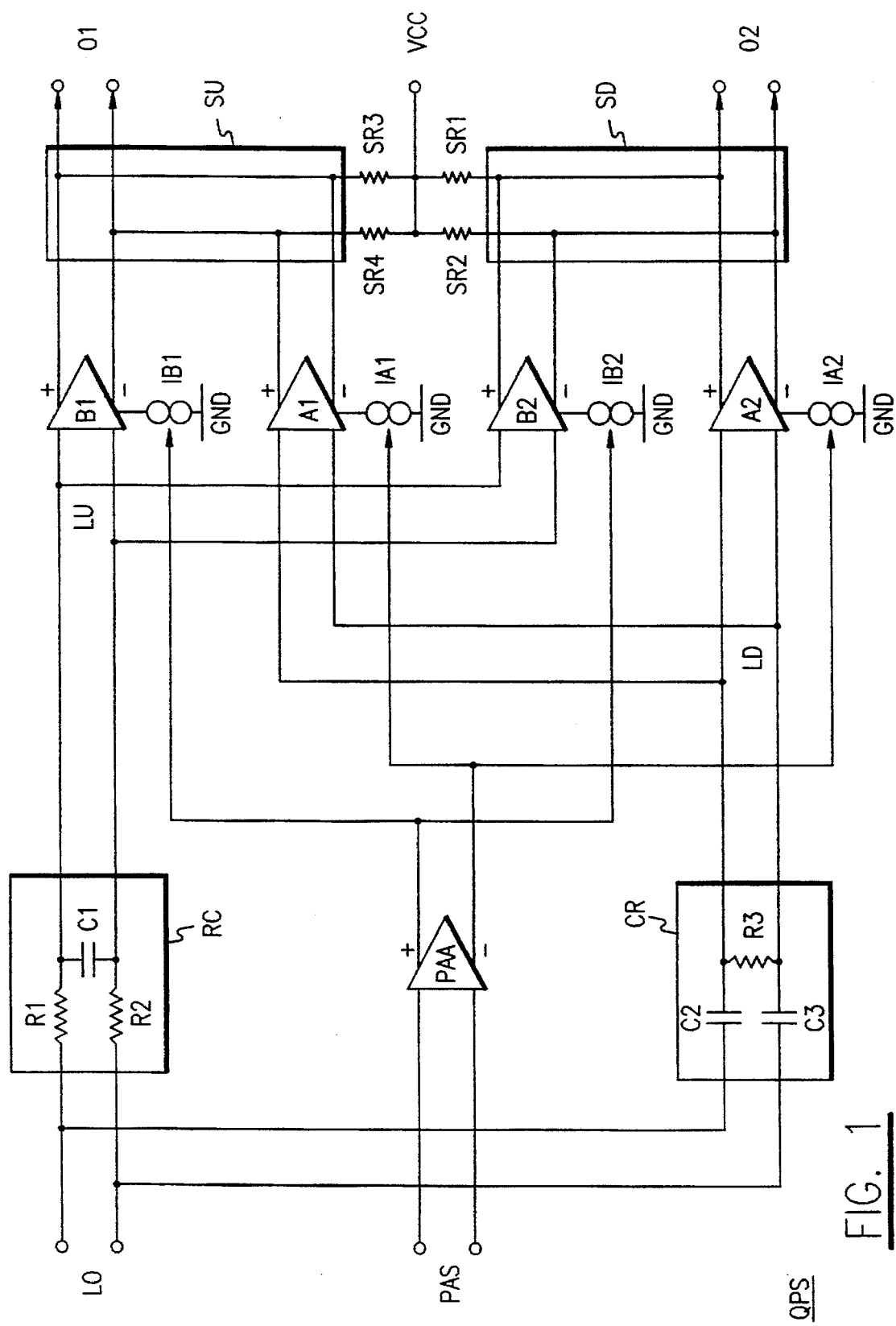
FIG. 1 is a schematic view of the tunable quadrature phase shifter QPS of the invention.

The tunable quadrature phase shifter QPS schematically represented in FIG. 1 is a differential device used in a zero IF (Intermediate Frequency) receiver or transmitter where an accurate and stable 90 degrees phase shift is required. QPS has an input LO to which a differential input signal is applied and two outputs O1 and O2 at which two distinct differential output signals V1 and V2 are provided. As will be explained later by making reference to FIGS. 2a and 2b, the phase shifter QPS may be so tuned that the phase vectors V1 and V2 of the like named respective output signals at O1 and O2 are orthogonal.

LO is connected to two parallel balanced filters RC and CR. The filter RC is a balanced Resistor-Capacitor integrator including two series resistors R1, R2 and a shunt capacitor C1, with R1=R2. The output terminals LU of RC are connected to inputs of a first differential operational amplifier B1 whose differential outputs (+) and (−) are connected to the terminals of the output O1. In a complementary way, the filter CR is a balanced Capacitor-Resistor differentiator including two series capacitors C2, C3 and a shunt resistor R3, with C1=2C2=2C3 and R3=2R1=2R2. The output terminals LD of CR are connected to inputs of a second differential operational amplifier A2 of which the differential outputs (+) and (−) are connected to the terminals of the output O2.

The phase vector of the signal at the output of the filter RC, i.e. at the output terminals LU, and the phase vector of the signal applied to the input LO are shifted up by approximately 45 degrees, whilst the phase vector of the signal at the output of the filter CR, i.e. at the output terminals LD, and the phase vector of the signal at LO are shifted down by approximately 45 degrees. As a result, the angle between the two phase vectors at LU and LD is roughly equal to 90 degrees. The error is due to technological mismatches between the resistors and capacitors as the present phase shifter QPS is integrated in an electronic chip. In order to obtain an exact 90 degrees phase shift between the two output signals, the following parts of the circuit are used.

The output terminals LU are connected to inputs of a third differential operational amplifier B2 whose differential outputs (+) and (−) are connected to the like-polarity terminals of the output O2 of the second amplifier A2. These terminals are further also connected to a +3 Volts supply VCC via respective load resistors SR1 and SR2, and constitute an algebraic summing circuit SD wherein the output currents of A2 and B2 are added. The corresponding output voltages are available across the load resistors SR1 and SR2.

Similarly, the terminals LD are connected to inputs of a fourth differential operational amplifier A1 of which the differential outputs (+) and (−) are connected to the opposite-polarity terminals of the output O1 of the first amplifier B1. These terminals are further also connected to VCC via respective load resistors SR4 and SR3, and constitute an algebraic summing circuit SU wherein the output currents of B1 and A1 are subtracted. The corresponding output voltages are available across the load resistors SR3 and SR4.

The four differential amplifiers B1, A2, B2 and A1 include a respective tail current source IB1, IA2, IB2 and IA1 which is connected to a ground terminal GND and is controlled by a differential external phase adjust control signal PAS applied thereto via a differential amplifier arrangement PAA. In more detail, one output (+) of PAA controls the current sources IB1 and IB2, whilst the other output (−) controls the current sources IA2 and IA1. The phase adjust signal PAS may for instance be supplied by an external control circuit (not shown) which measures the phase shift between the signals at the outputs O1 and O2.

The operation of the quadrature phase shifter QPS of FIG. 1 will be explained below by making reference to FIGS. 2a and 2b wherein the signals at the outputs of the amplifiers B1, A2, B2 and A1 are represented by their like-named phase vectors and the output signals are represented by their phase vectors V1 and V2.

In the normal operating status of QPS, the vectors B1, A2, B2 and A1 are equal to b1, a2, b2 and a1 respectively and have all the same absolute amplitude. Owing to the above interconnections, b1 and b2 have an identical phase orientation and are orthogonal to a1 and a2. Moreover, since the summing circuit SU subtracts a1 from b1, it may be seen as adding b1 and −a1. For this reason −a1 is shown in the FIGS. 2a and 2b rather than a1. The output phase vectors V1 and V2 are obtained by vectorially summing b1 and −a1 in SU and b2 and a2 in SD respectively. As the amplitudes of the vectors b1, a2, b2 and a1 are the same, the output vectors V1 and V2 are orthogonal.

In case the angle between V1 and V2 is not exactly equal to 90 degrees, the following corrections may be performed under control of the phase adjust signal PAS.

Figure 2A:
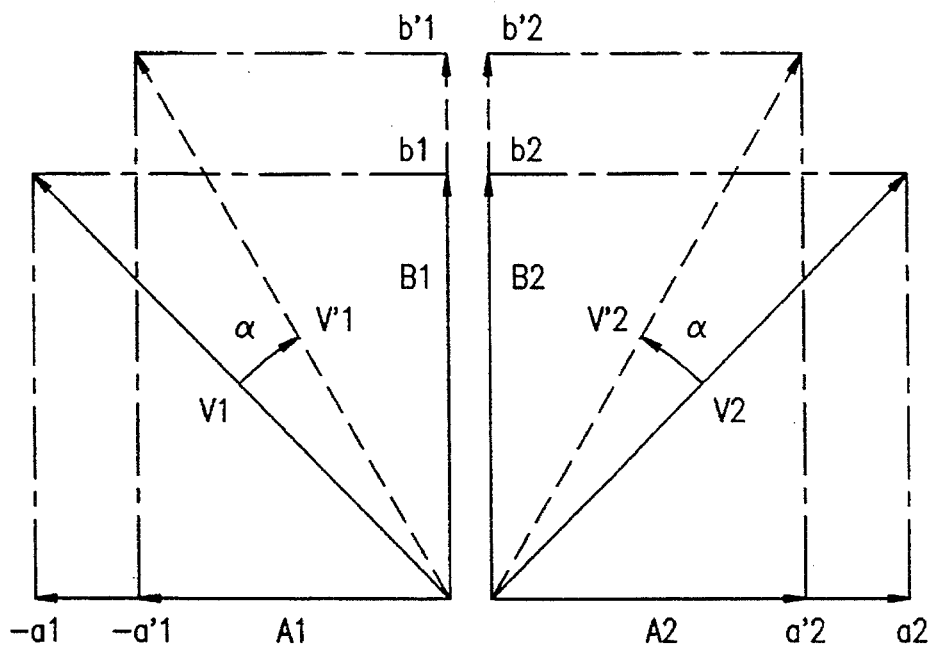
FIG. 2a and 2b show phase vector diagrams of signals used in the phase shifter QPS of FIG. 1.

If the angle between V1 and V2 is too large with respect to 90 degrees, PAS controls the tail current sources IB1, IA2, IB2 and IA1 so as to increase the phase vectors b1 and b2 to b'1 and b'2 respectively, whilst the phase vectors a2 and −a1 are then simultaneously decreased to a'2 and −a'1 respectively as shown in FIG. 2a. The value with which the phase vectors b1, b2 and a1, a2 are respectively increased and decreased is identical for all these vectors. As a result, the phase vector V1 is shifted up by an angle a to V'1, V'1 being equal to the sum of b'1 and −a'1, whilst the phase vector V2 is also shifted up by the same angle α to V'2, equal to the sum of b'2 and a'2.

Figure 2B:
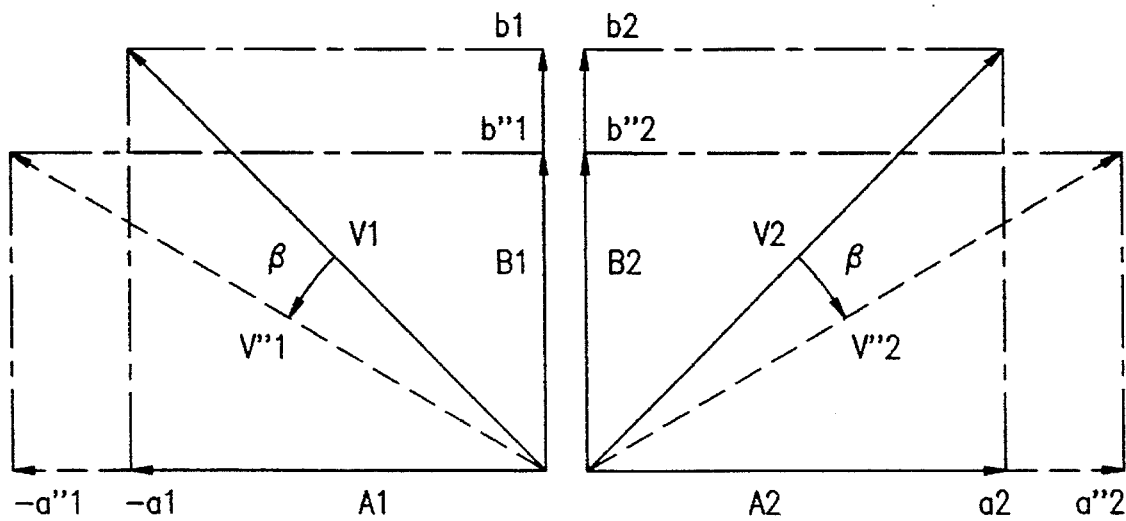

Conversely, if the angle between V1 and V2 is too small with respect to 90 degrees, PAS controls the tail current sources IB1, IA2, IB2 and IA1 so as to decrease the phase vectors b1 and b2 to b"1 and b"2 respectively, whilst the phase vectors a2 and −a1 are then simultaneously increased to a"2 and −a"1 respectively by a same value, as shown in FIG. 2b. As a result, the phase vector V1 is shifted down by an angle β to V"1, V"1 being equal to the sum of b"1 and −a"1, whilst the phase vector V2 is also shifted down by the same angle β to V"2, equal to the sum of b"2 and a"2.

Within the linear range of the tuning, a correction of ±6 degrees is possible in practice.

In order to keep the amplitude of the four phase vectors b1, a2, b2 and a1 constant over a temperature range from −25 to +75 degrees Celsius and for a supply voltage varying between 2.7 and 3.3 Volt, the present quadrature phase shifter QPS is provided with a feedback common mode control loop which is build in the differential amplifier arrangement PAA.

Figure 3:
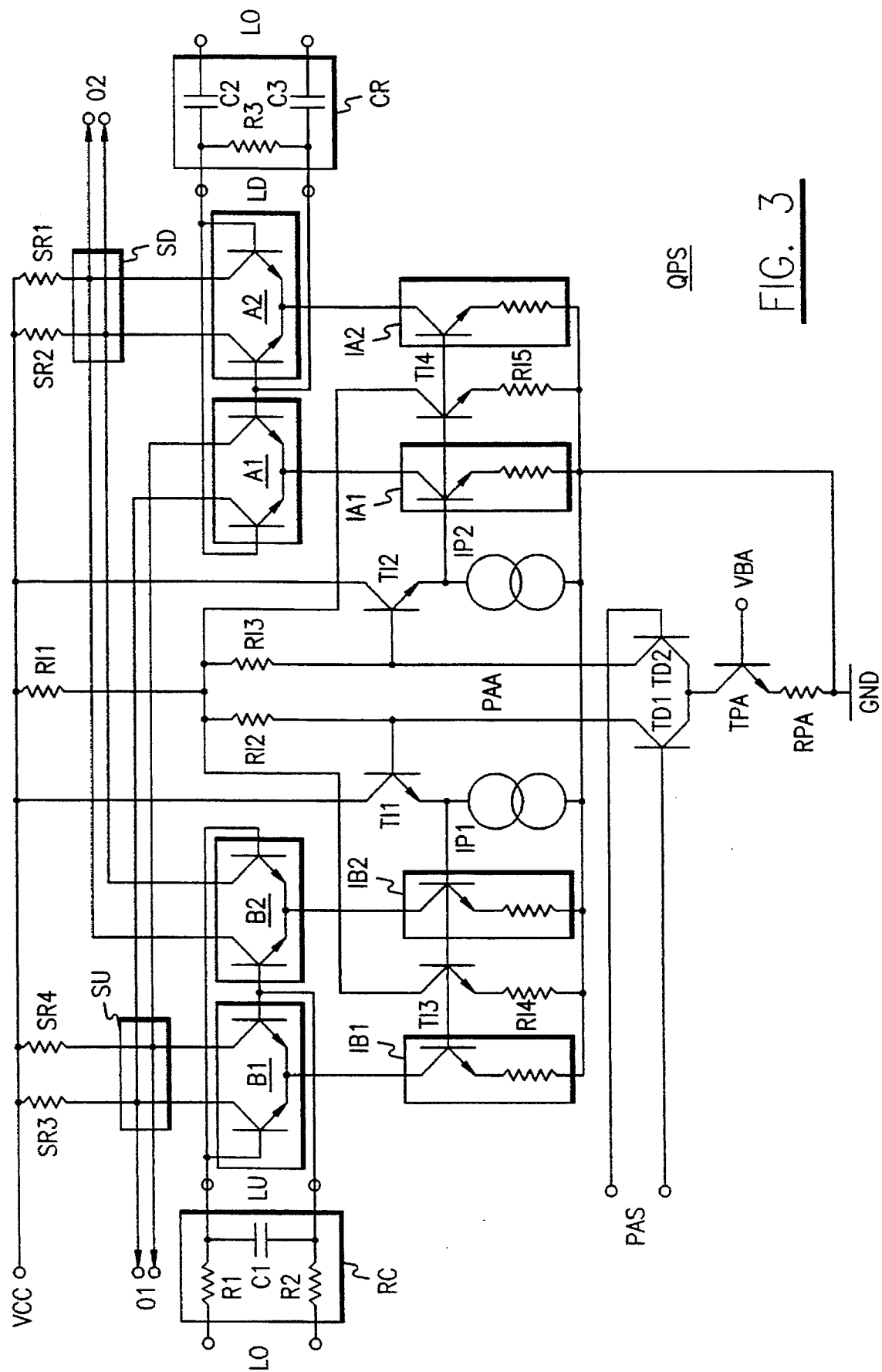
FIG. 3 represents the phase shifter QPS of FIG. 1 in more detail.

The purpose of this differential amplifier arrangement PAA is to accurately control the tail current sources IB1, IA2, IB2 and IA1 and its structure is illustrated in FIG. 3 which also shows the quadrature phase shifter QPS in more detail.

In this FIG. 3, the amplifiers B1, A2, B2 and A1 are represented by a differential pair of NPN transistors whose base electrodes are the inputs of the amplifier and whose collector electrodes are the outputs thereof. The emitter electrodes of these transistors are connected in common to the tail current source associated to the amplifier, i.e. IB1, IA2, IB2 and IA1 respectively. Each of these current sources includes, between the emitters of the transistors of the amplifier and the ground terminal GND, the series connection of the collector-to-emitter path of a NPN transistor and a resistor. The base electrodes of the latter transistors are connected to the outputs of the differential amplifier arrangement PAA as explained above. The amplifiers B1, A2, B2, A1, the current sources IB1, IA2, IB2, IA1 and the circuits RC, CR, SU and SD of QPS need not to be explained in more detail hereafter because they all have a structure which is well known to any person skilled in the art.

The amplifier arrangement PAA includes a differential pair of NPN transistors TD1 and TD2 to the base electrodes of which the differential external phase adjust control signal PAS is connected. This differential input signal PAS is for instance supplied by a preceding Digital-to-Analog converter (not shown). The emitter electrodes of TD1 and TD2 are connected in common to a constant current source constituted by the series connection of the collector-to-emitter path of an NPN transistor TPA and a resistor RPA connected to the ground terminal GND. A constant 'bandgap' bias voltage VBA is applied to the base electrode of TPA in order to maintain a constant current flow in TPA and RPA. The supply terminal VCC is connected to the collector electrodes of TD1 and TD2 via a common resistor RI1 in series with parallel resistors RI2 and RI3 respectively. The collector electrodes of TD1 and TD2 are further connected to the base electrodes of NPN transistors TI1 and TI2 respectively. TI1 and TI2 are mounted as emitter-followers with their collector-to-emitter path connected between the VCC supply terminal and the ground terminal GND via constant current sources IP1 and IP2 respectively. The emitter electrodes of TI1 and TI2 constitute the outputs of PAA and control the current sources IB1, IA2, IB2 and IA1 by supplying a bias voltage thereto. In more detail, the emitter electrode of TI1 is connected to the base electrode of the transistor included in the current sources IB1 and IB2, whilst the emitter electrode of TI2 is connected to the current sources IA1 and IA2.

In order to compensate for the tolerances on the resistors and possible fluctuations of the base-to-emitter voltage (VBE) of the transistors in function of temperature, PAA further includes two feedback branches. These branches perform a common mode feedback because the phase vectors b1, a2, b2 and a1 used to tune the angle between the output phase vectors V1 and V2 have different amplitudes, whilst their sum (or difference), i.e. V1 and V2, needs to remain constant.

Each feedback branch includes a current source comprising the collector-to-emitter path of an NPN transistor TI3, TI4 in series with a resistor RI4, RI5 connected to the ground GND respectively. The collector electrodes of the transistors TI3 and TI4 are connected in common to the junction point of the resistors RI1 and RI2, RI3, whilst their base electrodes are connected to the outputs of PAA, i.e. to the emitter electrodes of TI1 and TI2 respectively.

The current flowing in the current source TI3, RI4 is thus proportional to the phase vectors b2 and b1, whilst the current flowing in the current source TI4, RI5 is proportional to the phase vectors a1 and a2. The sum of these currents is constant and determines the voltage drop across the resistor RI1. This voltage drop controls the voltage at the base electrode of the emitter-followers TI1 and TI2 whereby the feedback loop is closed. In this way, any increase of the b2 and b1 phase vectors corresponding to an identical decrease of the a1 and a2 phase vectors, is accurately controlled.

Although the above phase shifter has been described as a fully differential device, it is also possible to obtain similar results by using single ended circuits. However, differential circuits have the advantage of improving the rejection of supply noise and of second order harmonics in case of distortion of the incoming signals.

In a preferred embodiment of the present phase shifter, the four differential amplifiers B1, A2, B2 and A1 are each replaced by a double differential pair amplifier in order to increase the bandwidth, as will be explained below.

Figure 4:
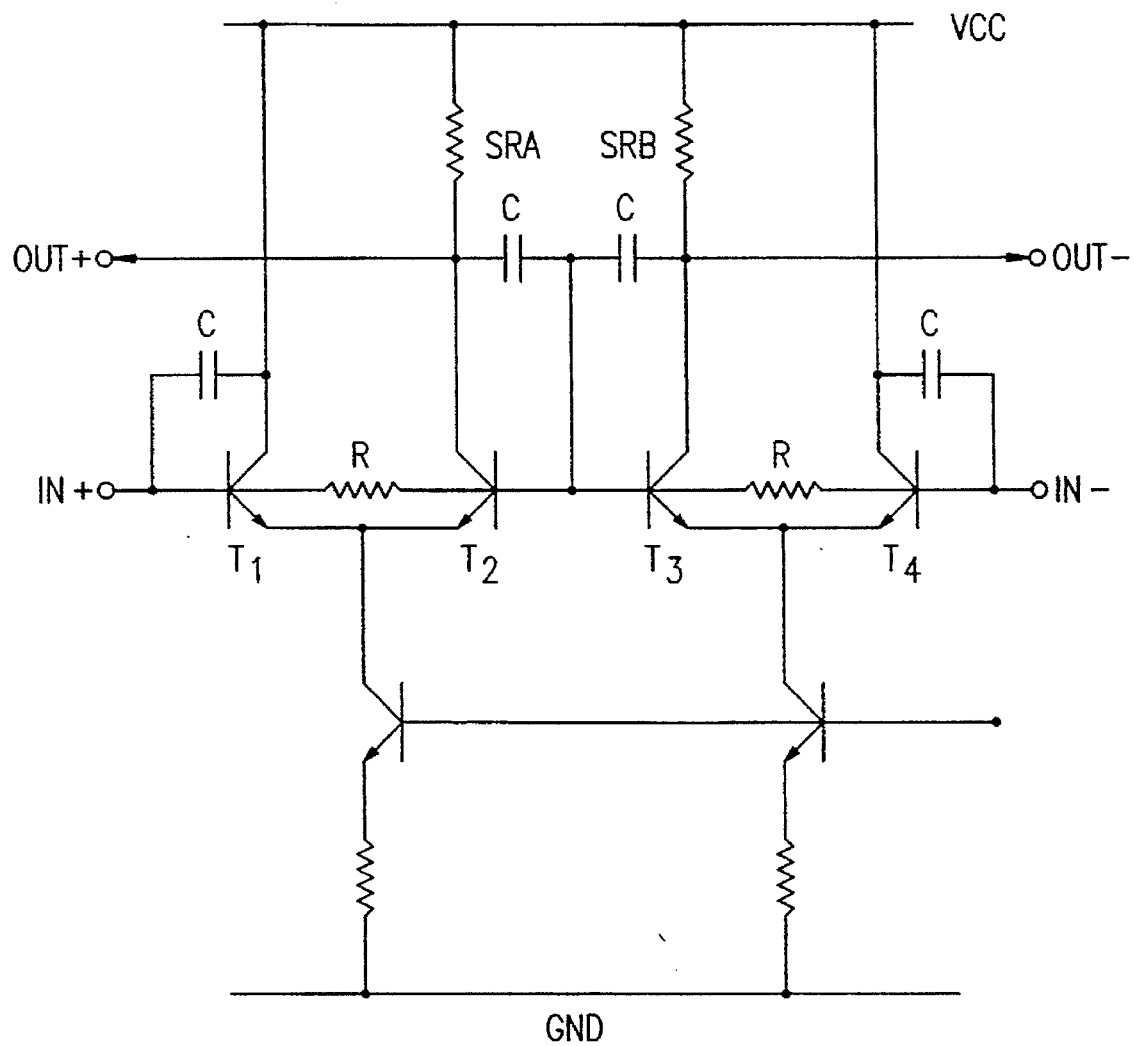
FIG. 4 shows a preferred embodiment of the amplifiers B1, A2, B2 or A1 of FIG. 1.

It is known that the bandwidth of a differential amplifier may be advantageously optimized by using a cascode arrangement. Such a cascode arrangement is generally obtained by adding a stage of common base transistors on top of the differential amplifier, i.e. by connecting common base transistors to the collector electrodes of the two transistors of the differential amplifier. Here however, because of the supply voltage being limited to 3 Volts, no headroom is left to add such an additional transistor level between the supply terminals VCC and GND. Therefore, to obtain a similar effect on the bandwidth, each of the above differential amplifiers B1, A2, B2 and A1 is advantageously replaced by a double differential pair amplifier and each of their associated current sources IB1, IA2, IB2 and IA1 is replaced by a double tail current source. Such an arrangement, also including load resistors SRA and SRB comparable to the above load resistors SR1 to SR4, is shown in FIG. 4 and generally referred to as DDPA.

DDPA has differential input terminals IN+ and IN− and differential output terminals OUT+ and OUT− which may be compared to the above device outputs O1 or O2. In the double differential pair arrangement DDPA the above current source IB1, IA2, IB2 or IA1 is replaced by a double tail current source, i.e. by two parallel current branches each including the series connection of the collector-to-emitter path of a bias NPN transistor and a resistor connected to the ground GND. The two current branches are simultaneously controlled via the base electrode of their bias transistor. Each current branch is coupled to the supply terminal VCC via a distinct branch of the amplifier including the emitter-to-collector path of an NPN transistor T2, T3 in series with a load resistor SRA, SRB respectively. The output OUT+, OUT− is connected to the junction point of the collector electrode of the transistor T2, T3 with the associated load resistor SRA, SRB respectively. Each branch T2, SRA and T3, SRB is connected in parallel with a second branch comprising the emitter-to-collector path of a second transistor T1, T4 between the emitter electrode of T2, T3 and the supply terminal VCC respectively. The base electrodes of T2 and T3 are interconnected and coupled to their respective collector electrodes, i.e. to the outputs OUT+ and OUT−, via a capacitor C. The differential input terminals IN+ and IN− are connected to the base electrodes of the transistors T1 and T4 and the latter bases are further connected to the collector electrodes of their respective transistor via a capacitor C. The base electrodes of the transistors T1 and T4 are further connected to the base electrodes of the transistors T2 and T3 respectively via an high impedance resistor R whereby a DC base current is supplied to the bases of T2 and T3 without affecting the AC input signal.

The two transistors T2 and T3 operate as common base transistors as the middle base node is virtually grounded for balanced inputs at IN+/IN−, except for the fact that the emitters of T2 and T3 are driven from the low impedance emitters of T1 and T4. But at least the Miller effect through the collector-base capacitor is eliminated and an extended bandwidth is obtained at the expense of a double tail current.

While the principles of the invention have been described above in connection with specific apparatus, it is to be clearly understood that this description is made only by way of example and not as a limitation on the scope of the invention.

What is claimed is:

1. A differential amplifier (DDPA) coupled to a tail current source and having a differential input (IN+, IN−) and a differential output (OUT+, OUT−), wherein said tail current source is a variable double tail current source having a first and second current branch each with a series connection of a respective bias transistor and a respective resistor, both bias transistors being simultaneously controlled by a control signal coupled to respective bases of respective bias transistors; and wherein said differential amplifier (DDPA) is a double differential pair amplifier having first (SRA, T2) and second (SRB, T3) branches each being connected between a power supply (VCC) and respectively to said first and second current branch, each of said first and second branches having a respective series connection with a respective load resistor (SRA, SRB) and a respective first transistor (T2, T3) and having respective control electrodes that are interconnected, said double differential pair amplifier (DDPA) also having third (T1) and fourth (T4) branches each being connected between said power supply (VCC) and respectively to said first (SRA, T2) and second (SRB, T3) current branches, each of said third (T1) and fourth (T4) branch having a corresponding second transistor (T1, T4) with a corresponding control electrode that constitutes an associated differential input (IN+, IN−) of said double differential pair amplifier (DDPA), junction points of respective load resistors (SRA, SRB) with respective first transistors (T2, T3) constituting an associated differential output (OUT+, OUT−) of said double differential pair amplifier (DDPA), and the respective control electrodes of said respective first transistors (T2, T3) being connected via a respective second resistor (R) to corresponding control electrodes of corresponding second transistors (T1, T4) and also being connected via a respective capacitor (C) to the junction points of the respective load resistors (SRA, SRB) with said respective first transistors (T2, T3).

2. A differential amplifier according to claim 1, characterized in that all said transistors are bipolar transistors.

* * * * *